United States Patent
Stoddard et al.

(10) Patent No.: US 6,641,411 B1
(45) Date of Patent: Nov. 4, 2003

(54) LOW COST HIGH SPEED CONNECTOR

(75) Inventors: Donald J. Stoddard, San Jose, CA (US); Matthew J. Schumacher, Cypress, TX (US)

(73) Assignee: Maxxan Systems, Inc., San Jose, CA (US)

(*) Notice: Subject to any disclaimer, the term of this patent is extended or adjusted under 35 U.S.C. 154(b) by 0 days.

(21) Appl. No.: 10/202,286

(22) Filed: Jul. 24, 2002

(51) Int. Cl.[7] .................................................. H01R 4/66
(52) U.S. Cl. ...................................................... 439/108
(58) Field of Search ................................ 439/108, 101, 439/608

(56) References Cited

U.S. PATENT DOCUMENTS

| | | | | |
|---|---|---|---|---|
| 5,145,387 A | * | 9/1992 | Ichihashi | 439/108 |
| 5,174,770 A | * | 12/1992 | Sasaki et al. | 439/108 |
| 5,224,867 A | * | 7/1993 | Ohtsuki et al. | 439/108 |
| 5,399,104 A | * | 3/1995 | Middlehurst et al. | 439/608 |
| 5,525,067 A | * | 6/1996 | Gatti | 439/108 |

* cited by examiner

*Primary Examiner*—Gary Paumen
(74) *Attorney, Agent, or Firm*—Trop, Pruner & Hu, P.C.

(57) ABSTRACT

Embodiments of the present invention may provide for high-density and high speed interconnections while maintaining reduced signal interference. In some embodiments, differential signals are organized in connectors such that differential signal pairs are orthogonal to each other. In other embodiments, differential signal tri-conductor sets may be oriented such that they are generally orthogonal to each other. The orthogonal contact organization may provide for reduced coupling between differential signals.

13 Claims, 5 Drawing Sheets

US 6,641,411 B1

LOW COST HIGH SPEED CONNECTOR

FIELD OF THE INVENTION

The present disclosure relates to electrical connectors that may be utilized for high speed interconnections within electronic equipment.

BACKGROUND

Complex high speed electronic systems often require electronics and interface components to be produced as subassemblies and interconnected for operations. For example, in computer systems it is common to have a high speed microprocessor and other electronics that interconnect through a high speed bus to perform the desired functions. The same holds true for modern high speed network systems wherein a large number of high speed subassemblies need to be interconnected to provide for the complex functionality demanded in the market place today.

However, interconnecting high speed electronics requires considerable care to prevent signal deterioration from, among other reasons, unwanted coupling between adjacent signals that may pass through the same connector. One method of reducing unwanted signal deterioration from unwanted coupling between adjacent signals may be achieved by surrounding a particular signal conductor, or conductor pair in a differential system, with isolation areas such as ground pads that may substantially encircle a conductor or conductor pair. Such a system is illustrated in FIG. 1.

Referring now to FIG. 1, ground pads 101 substantially encircle differential conductor pairs 103. By utilizing the ground pads 101, substantial isolation of the differential signal pair 103 may be achieved from unwanted interference from nearby conductors such as the differential conductive pair 105.

However, this method of signal isolation is highly inefficient. For example, the connector shown in FIG. 1 provides only 30 signal conductors out of 100 contact pins that may be available. That is to say, in the example in FIG. 1, approximately 30 signal pins are available out of the 100 possible yielding an efficiency of only about 30%.

Therefore, what is needed is a method and apparatus for providing high-density interconnections utilizing relatively inexpensive connectors that may still provide acceptable isolation between adjacent conductors or conductor pairs and other advantageous.

BRIEF DESCRIPTION OF THE DRAWINGS

The invention may be best understood by referring to the following description and accompanied drawings that are used to illustrate embodiments of the invention. In the drawings.

DETAILED DESCRIPTION

Figure 1:
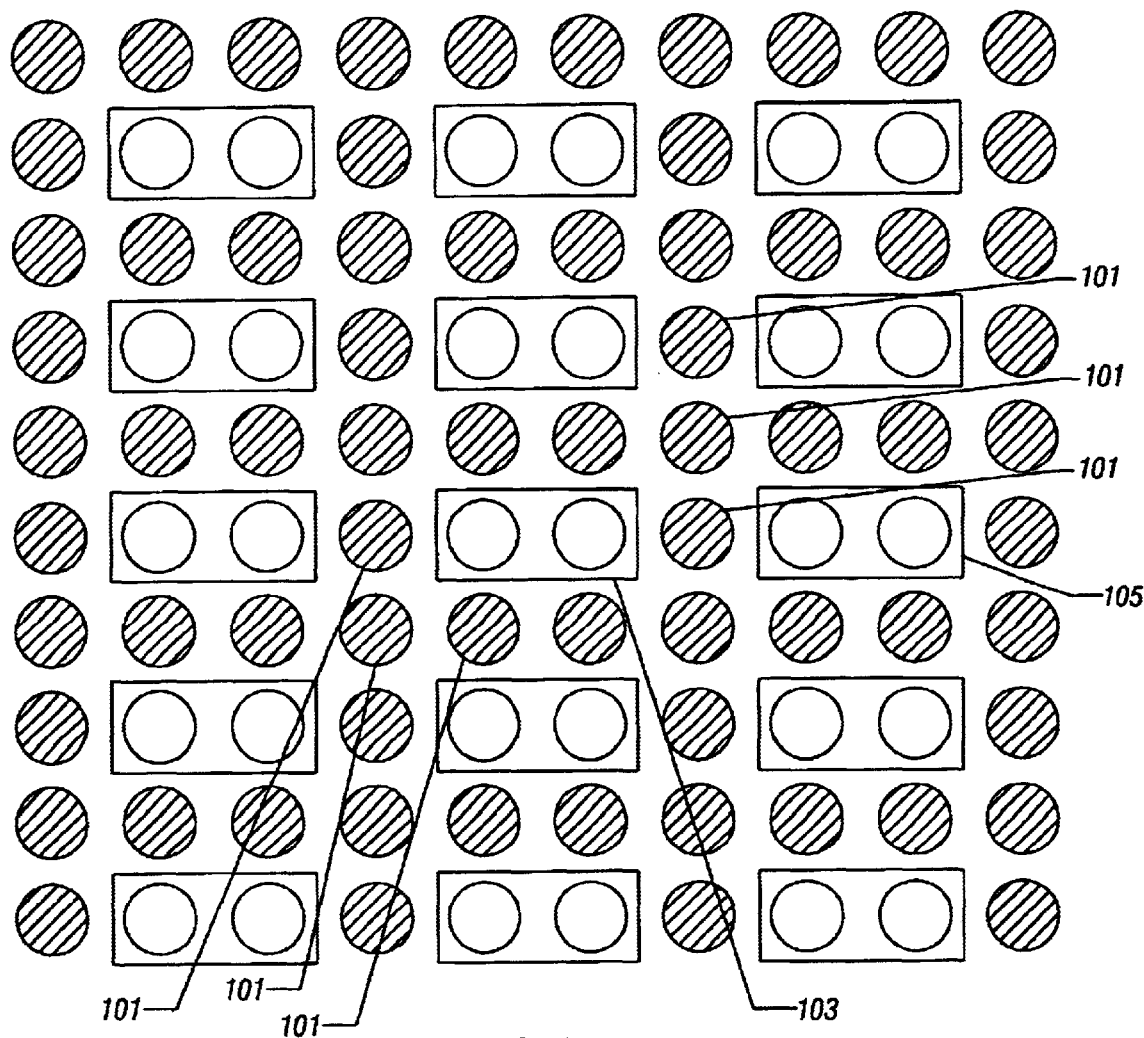
FIG. 1 illustrates an electrical interconnection method and connector.

Referring now to FIG. 1, a 100 pin connector 201 is illustrated having ten rows of ten conductors. For use with differential signals, the conductors may be configured as conductor pairs such as conductor pairs 203 and 205. A conductor pair for ease of illustration may be illustrated as two conductors within a rectangular box such as 203 and 205 as illustrated. Each conductor pair may include two signal conductors. For example, conductor pair 203 may include a first conductor 207 and a second conductor 209. In like manner, conductor pair 205 may include a first conductor 211 and a second conductor 213.

By organizing the differential signal conductors orthogonal to each other such as conductor pairs 203 and 205, the unwanted signal coupling to conductor pair 203 from conductor pair 205 may be reduced. Additionally, any coupling that may occur may be disregarded by a differential signal receiver (not shown) that may typically reject common mode signals that maybe superimposed on the differential signal pairs. For example, if the signal on conductor 211 were to couple to the differential signal pair conductors 207 and 209, because it is approximately equal distance between the two conductors 207 and 209, any signal coupling would be approximately equal between conductors 207 and 209. This coupling may be viewed as common mode noise or signals that may easily be rejected by differential receiver electronics (not illustrated).

The signal conductors that may not be utilized such as conductors 215 may be open conductors or coupled to a signal ground to provide additional isolation. A conductor having differential signal pairs as illustrated and described in association with FIG. 2 has approximately an 82% utilization of available pins.

Figure 3:
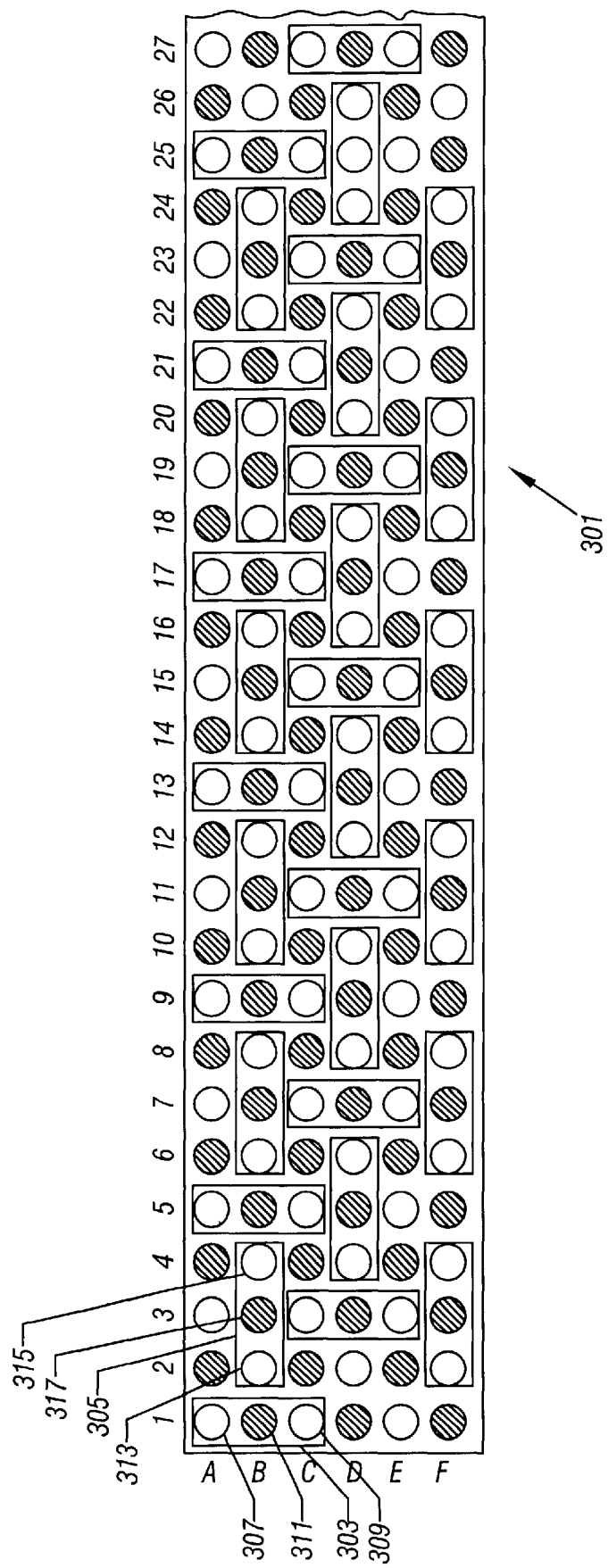
FIG. 3 illustrates a rectangular connector and connection method according to embodiments of the present invention.

Referring now to FIG. 3, a partial view of a 144 pin connector such as a Molex Corporation Model 73780 is illustrated having differential signals according to embodiments of the present invention. The connector 301 may be organized as a connector of six rows (A–F) and a plurality of columns of which 27 (1–27) are illustrated.

Differential signals may be coupled through connector 301 utilizing conductor triads such as triad 303 and 305. Triad 303 has a first differential signal conductor 307 and a second signal conductor 309 and a signal ground connection 311. In like manner, signal triad 305 includes a first conductor 313, a second conductor 315 and a signal ground conductor 317.

The conductor triads 303 and 305 are configured approximately orthogonal to each other such that signal conductor 313 is approximately equally spaced between signal conductors 309 and 307. As was discussed in association with FIG. 2, any signal on conductor 313 may be coupled equally to conductors 307 and 309 (if at all) and therefore be rejected by differential receiving electronics (not shown) as common mode noise or signals.

The addition of a central signal ground connection such as 311 and 317 may serve to provide additional isolation between adjacent signal conductors adjacent to a connector triad such as conductor 313. This additional isolation may reduce unwanted coupling when utilizing high speed signals.

A connector configured as illustrated and described in association with FIG. 3, may provide 12 signal conductors for every four rows. This utilization will then be approximately 50% while at the same time providing for additional signal isolation.

Figure 4:
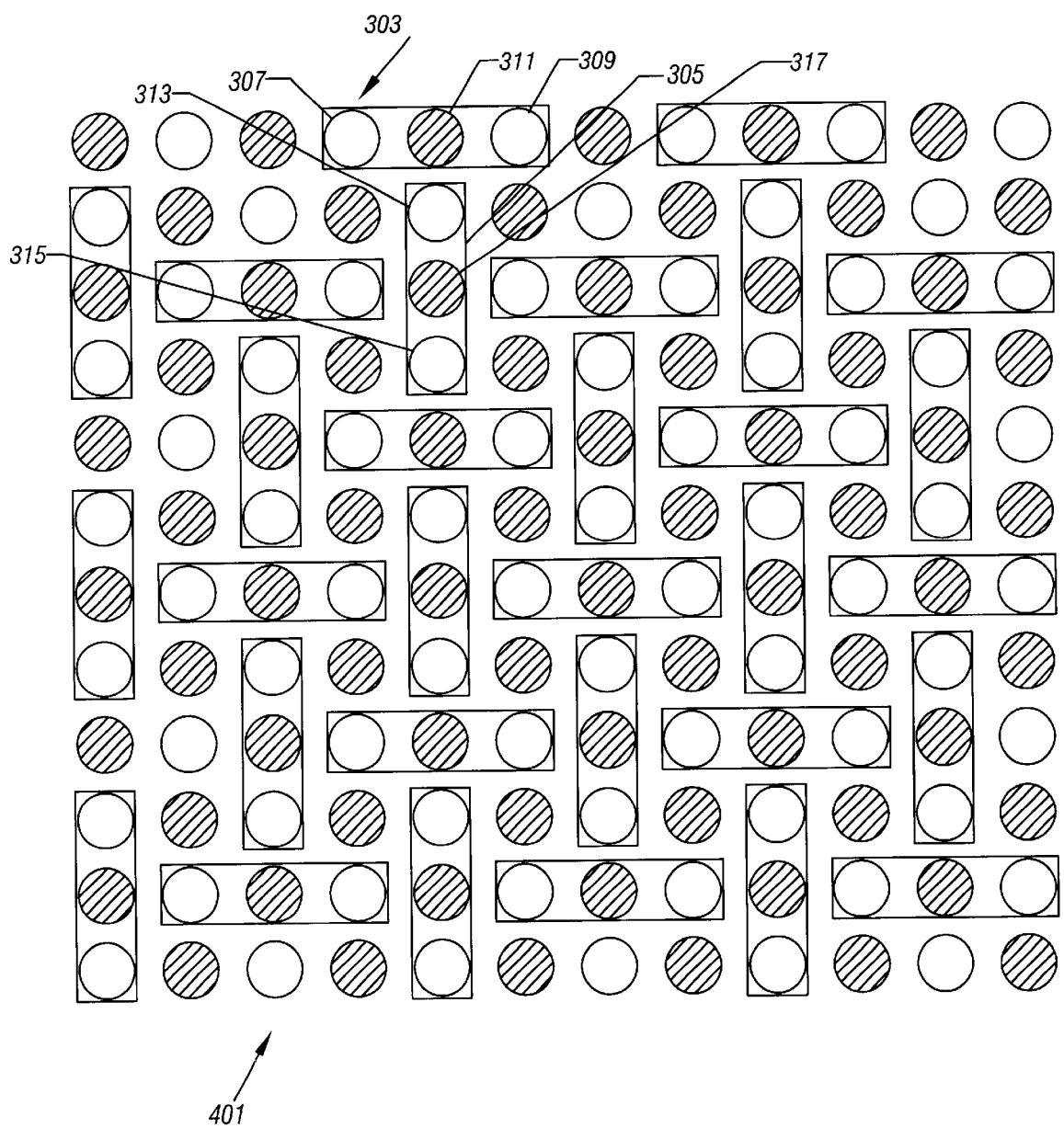
FIG. 4 illustrates a substantially square connector and connection method according to embodiments of the present invention.

Referring now to FIG. 4, a 144 pin connector 401 is illustrated utilizing differential signal triads such as triads 303 and 305. The operation of the signal triads is substantially as described in association with FIG. 3.

The configuration of connector 401 may provide connections, in some embodiments, for 30 signal triads. This may provide for a high-density and low cost and low coupling connector as may be utilized for a pin grid array connector, BGA or pin connections to a circuit board.

Figure 5:
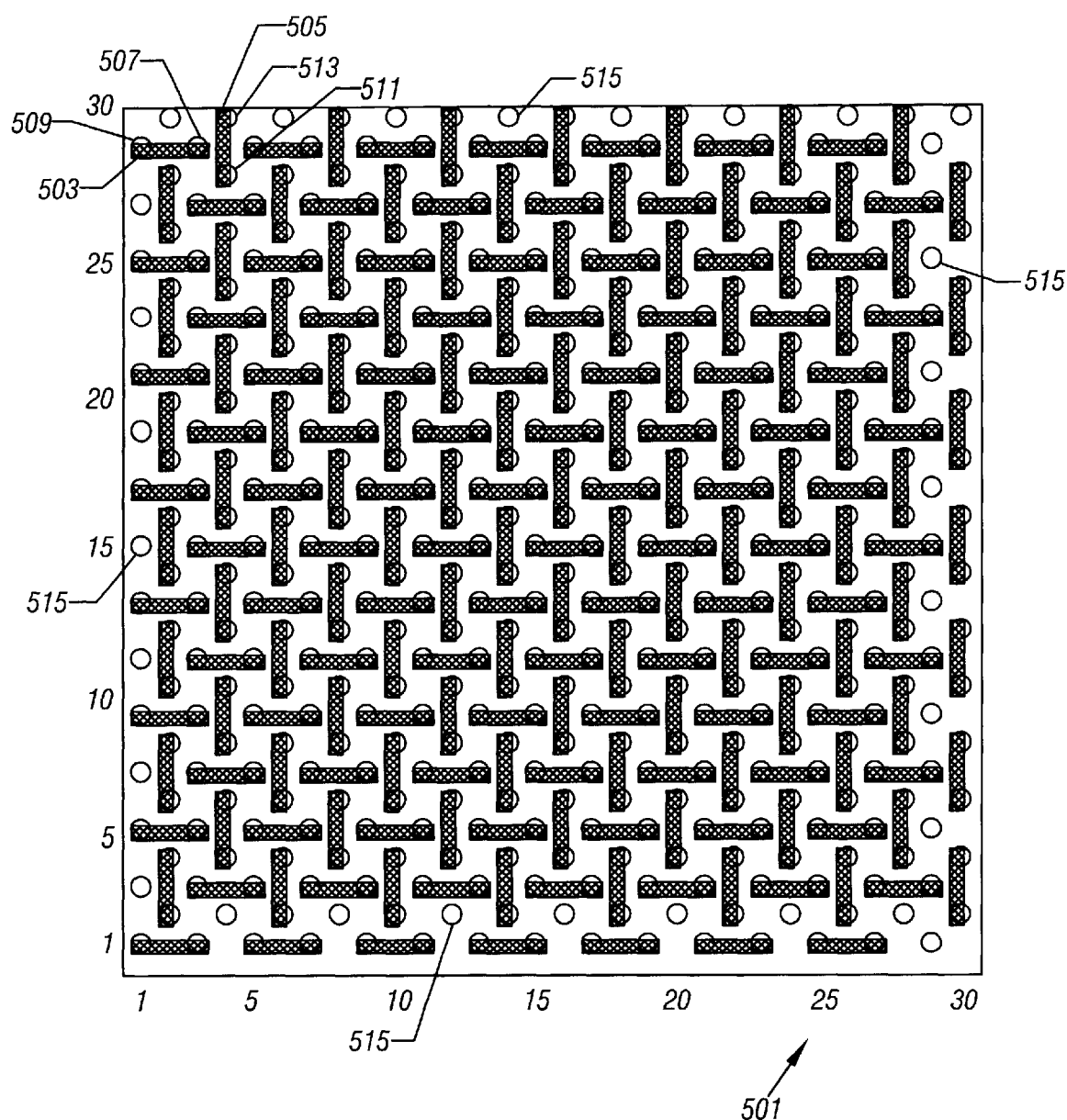
FIG. 5 illustrates a high-density connector and connection method according to embodiments of the present invention.

Referring now to FIG. 5, a 450 pin connector is illustrated according to embodiments of the present invention. The connector pins may be organized to provide for differential signal pairs such as signal pair 503 and 505. Differential signal pairs 503 include two signal conductors 507 and 509. In like manner, differential signal pair 505 includes two conductors 511 and 513.

Figure 2:
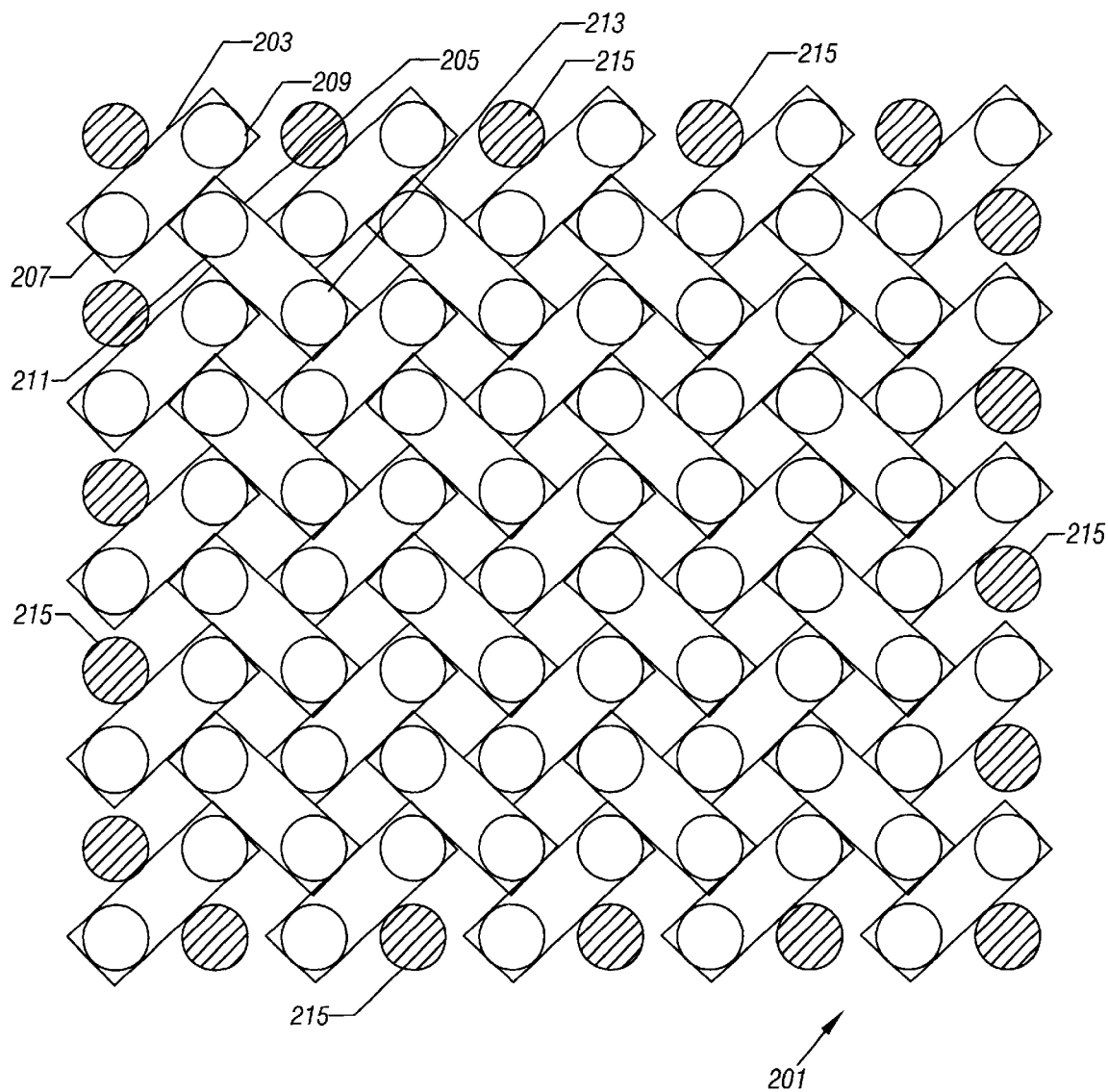
FIG. 2 illustrates a connection method and connector according to embodiments of the present invention.

As was discussed in association with FIG. 2, the differential conductor pairs 503 and 505 are organized generally orthogonally to each other such that adjacent contact such as contacts 507 is approximate equal distance between 513 and 511. This organization may provide for a reduced interference level between adjacent connections for the reasons previously described.

The unused pins, of which pins 515 are representative, may be connected to signal ground for impedance and signal isolation reasons. Configured as illustrated, connector 501 may provide for 210 differential pairs with reduced unwanted signal coupling.

While the present invention has been described with respect to a limited number of embodiments, those skilled in the art will appreciate numerous modifications and variations there from. For example, other types of connectors with different geometry and pin counts may be utilized. The connectors may be of the type allowing separation between two connector sections. In other cases, the connector may be fixed by soldering or other connection methods. Therefore, it is intended that the appended claims cover all such modifications and variations that fall within the true spirit and scope of the present invention.

What is claimed is:

1. An electrical signal coupling system comprising:
   a first differential signal tri-connector contact set;
   a second differential signal tri-connector contact set;
   each tri-connector contact set having a center signal ground connection; and
   the first and second differential signals tri-connector contact set are adjacent and generally orthogonally oriented to each other.

2. The electrical signal coupling system as in claim 1 wherein each tri-connector contact set includes a first and a second signal contact and the first contact of the second differential signal tri-connector contact set is adjacent to the signal ground connection of the first differential signal tri-connector contact set.

3. The electrical signal coupling system as in claim 2 wherein the first contact of the second differential signal tri-conductor contact set is approximately equally spaced from the first and second signal contacts of the first differential signal tri-connector contact set.

4. The electrical signal coupling system as in claim 3 wherein the contacts are part of a pin grid array connector.

5. The electrical signal coupling system as in claim 3 wherein the contacts are part of a ball grid array connector.

6. The electrical signal coupling system as in claim 3 wherein the contacts are part of pins in a supporting structure and are operative to mate with contacts in a mating structure.

7. The electrical signal coupling system as in claim 3 wherein the contacts are part of an electrical socket that incorporates approximately parallel contacts to transmit signals.

8. An electrical coupling system comprising:
   a first differential signal connector set;
   a second differential signal connector set; and
   the first and second differential signal connectors sets are adjacent and generally orthogonally oriented to each other.

9. The electrical signal coupling system as in claim 8 wherein each differential signal connector set includes a first and second contact and the first contact of the second differential connector set is approximately equally spaced from the first and second signal contacts of the first differential connector set.

10. The electrical signal coupling system as in claim 9 wherein the contacts are part of a pin grid array connector.

11. The electrical signal coupling system as in claim 9 wherein the contacts are part of a ball grid array connector.

12. The electrical signal coupling system as in claim 9 wherein the contacts are part of pins in a supporting structure and are operative to mate contacts in a mating structure.

13. The electrical signal coupling system as in claim 9 wherein the contacts are part of an electrical socket that incorporates approximately parallel contacts to transmit signals.

* * * * *